(12) United States Patent
Takeoka et al.

(10) Patent No.: US 10,615,090 B2
(45) Date of Patent: Apr. 7, 2020

(54) SEAL RING, ELECTRONIC COMPONENT HOUSING PACKAGE, ELECTRONIC DEVICE, AND MANUFACTURING METHODS THEREOF

(71) Applicants: TANAKA KIKINZOKU KOGYO K.K., Chiyoda-ku, Tokyo (JP); KYOCERA CORPORATION, Kyoto-shi, Kyoto (JP)

(72) Inventors: Harumi Takeoka, Kyoto (JP); Kazuharu Yoshida, Tokyo (JP); Ryuta Ido, Oshu (JP); Junichi Takeuchi, Oshu (JP)

(73) Assignees: TANAKA KIKINZOKU KOGYO K.K., Tokyo (JP); KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/064,582

(22) PCT Filed: Dec. 19, 2016

(86) PCT No.: PCT/JP2016/087745
§ 371 (c)(1),
(2) Date: Jun. 21, 2018

(87) PCT Pub. No.: WO2017/110728
PCT Pub. Date: Jun. 29, 2017

(65) Prior Publication Data
US 2018/0374767 A1    Dec. 27, 2018

(30) Foreign Application Priority Data

Dec. 22, 2015 (JP) ................................ 2015-250472

(51) Int. Cl.
*H01L 23/10* (2006.01)
*H03H 9/02* (2006.01)
(Continued)

(52) U.S. Cl.
CPC ............... *H01L 23/10* (2013.01); *H03H 9/02* (2013.01); *H01L 2924/16195* (2013.01);
(Continued)

(58) Field of Classification Search
CPC ..................... H01L 23/10; H01L 23/02; H01L 2924/16195; H03H 9/02; H03H 9/1014; H03H 9/1071; H03H 3/02; H03H 3/08
See application file for complete search history.

(56) References Cited

U.S. PATENT DOCUMENTS

| 6,306,526 B1 * | 10/2001 | Yamamoto | B23K 35/268 |
| | | | 257/704 |
| 2004/0161530 A1 * | 8/2004 | Stark | B81B 7/0067 |
| | | | 427/58 |

(Continued)

FOREIGN PATENT DOCUMENTS

| JP | 2002-30393 A | 1/2002 |
| JP | 2003-133449 A | 5/2003 |

(Continued)

OTHER PUBLICATIONS

PCT, International Search Report for PCT/JP2016/087745, dated Feb. 21, 2017.

*Primary Examiner* — Sitaramarao S Yechuri
(74) *Attorney, Agent, or Firm* — Orrick, Herrington & Sutcliffe LLP; Joseph A. Calvaruso; K. Patrick Herman

(57) ABSTRACT

An object of the present invention is to provide a seal ring having a metal brazing material layer on one surface of a base material containing KOVAR and a metal plating layer on the other surface, ensuring that the seal ring can prevent generation of a stain on the surface of a metal plating layer and excellent airtightness of an electronic component housing package can be achieved. The present invention has attained the object above by a seal ring which is an annular sealing ring having a nickel layer on the first surface of a (Continued)

base material containing KOVAR (iron-nickel-cobalt alloy) and a metal brazing material layer on the second surface opposite the first surface, wherein the thickness of the nickel layer is from 0.1 to 20 µm.

12 Claims, 3 Drawing Sheets

(51) Int. Cl.
    *H03H 3/02*     (2006.01)
    *H03H 9/10*     (2006.01)
    *H03H 3/08*     (2006.01)

(52) U.S. Cl.
    CPC ............... *H03H 3/02* (2013.01); *H03H 3/08* (2013.01); *H03H 9/1014* (2013.01); *H03H 9/1071* (2013.01)

(56) References Cited

U.S. PATENT DOCUMENTS

2009/0068489 A1*   3/2009   Miyazaki ............ B81C 1/00269
                                                                      428/576
2017/0330811 A1*  11/2017   Yokota .................... H01L 23/02

FOREIGN PATENT DOCUMENTS

| JP | 2003-158211 A | 5/2003 |
| --- | --- | --- |
| JP | 2004-063960 A | 2/2004 |
| JP | 2009-140784 A | 6/2009 |
| JP | 2011-119338 A | 6/2011 |

\* cited by examiner

[Fig. 1A] 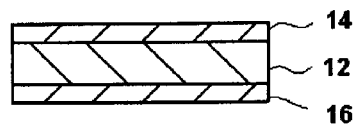
[Fig. 1B] 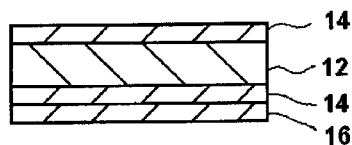
[Fig.2] 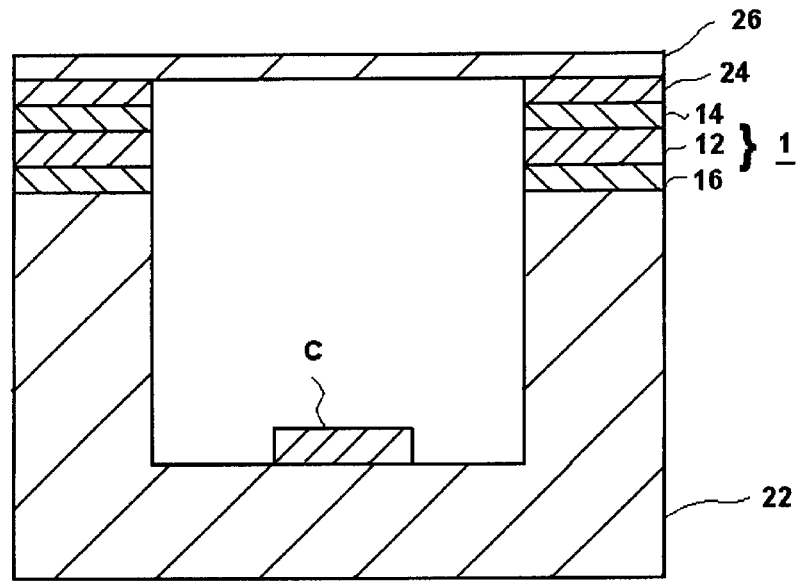

[Fig. 3]
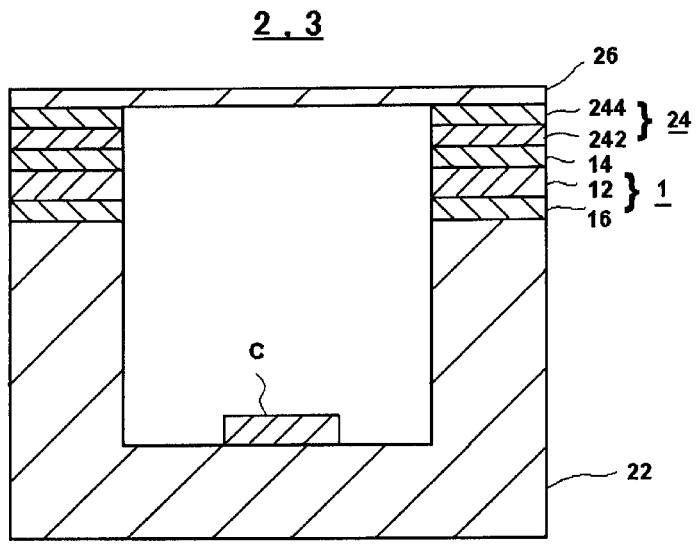
[Fig.4]
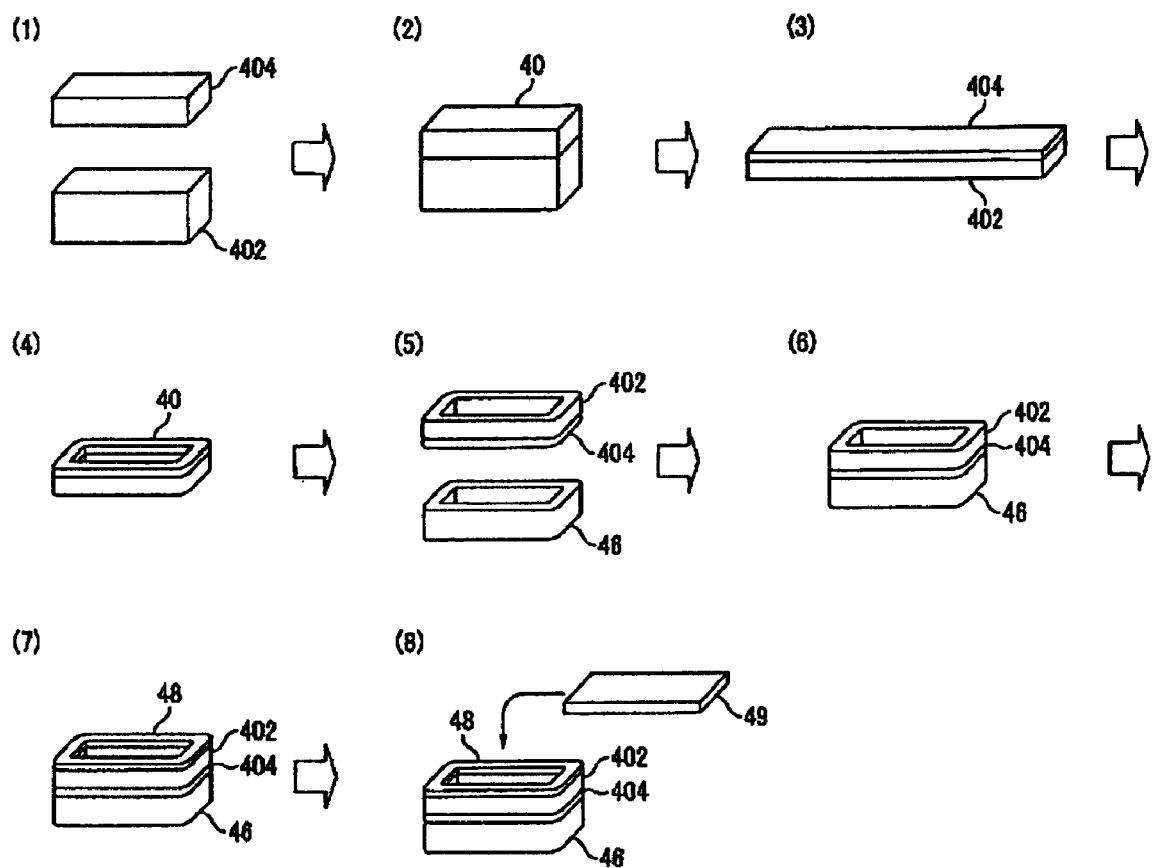

[Fig.5]
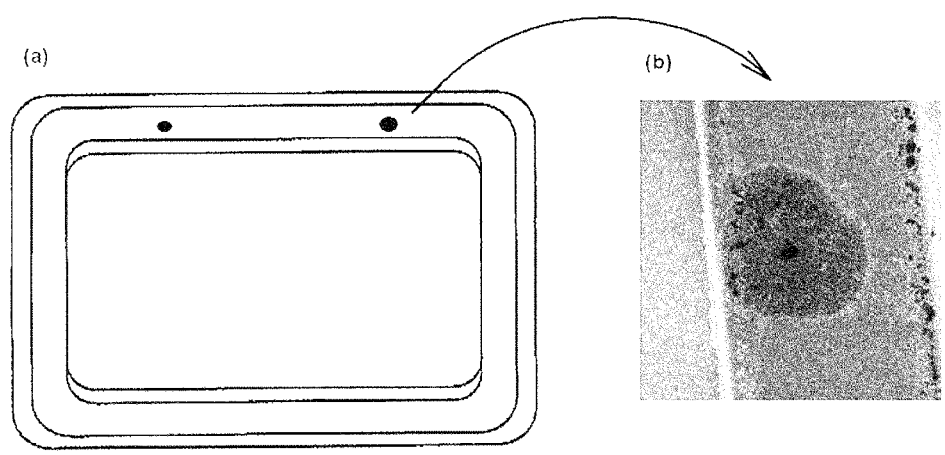

SEAL RING, ELECTRONIC COMPONENT HOUSING PACKAGE, ELECTRONIC DEVICE, AND MANUFACTURING METHODS THEREOF

TECHNICAL FIELD

The present invention relates to a seal ring, an electronic component package, an electronic device, and manufacturing methods thereof.

BACKGROUND ART

An electronic component such as SAW filter and crystal oscillator employed in an electronic device such as mobile phone is used as a package fabricated by housing such an electronic component in a case with an opening and sealing the case by putting a lid thereon. The package is sealed so as to prevent the properties of the electronic component from becoming unstable due to moisture or oxygen in the air.

In this electronic component package, the case is generally made of ceramic such as alumina and aluminum nitride, and the lid is composed of a low thermal expansion metal such as KOVAR (iron-nickel-cobalt alloy, U.S. Registered Trademark Serial No. 71367381) and iron-nickel alloy.

The method for joining the lid to the case includes a method of achieving the joining by use of a clad material obtained by previously bonding a brazing material to a base material that works out to a lid (see, for example, Patent Document 1). Apart from this, there is also a method of providing, on the above-described ceramic-made case, a frame-shaped seal ring composed of a metal such as KOVAR clad with a brazing material, and joining a lid to the top surface of the seal ring (see, for example, Patent Document 2).

FIG. 4 is a diagram for explaining the method for joining a lid to a case housed therein an electronic component by using a seal ring.

In FIG. 4, (1) KOVAR 402 and a metal brazing material 404 are prepared, (2) these are laminated together to form a clad material 40, (3) the clad material is processed by rolling, (4) the rolled clad material 40 is pressed into a ring shape, (5) a ceramic-made case 46 having housed therein an electronic component is prepared, (6) the metal brazing material 404 and the case 46 are seam-welded to come into contact with each other, (7) a metal layer 48 such as nickel or gold is provided on the top surface of KOVAR 402 of the seal ring, and (8) a lid 49 is joined to the top of the metal layer 48.

However, when a conventional seal ring is used, a phenomenon of generation of a stain on the top surface of the metal layer 48 is observed. FIG. 5(a) is a plan view illustrating two stains generated on the conventional metal layer 48, and FIG. 5(b) is an enlarged photograph thereof. The stain illustrated in FIGS. 5(a) and 5(b) corresponds to a void of the metal layer 48 and causes a serious problem of deterioration of the airtightness between the seal ring and the lid 49.

RELATED ART

Patent Document

Patent Document 1: JP-A-2003-158211
Patent Document 2: JP-A-2003-133449

SUMMARY OF THE INVENTION

Problems to Be Solved by the Invention

Accordingly, an object of the present invention is to provide a seal ring capable of preventing generation of a stain on the surface of a metal layer disposed on the seal ring and achieving excellent airtightness of an electronic component housing package, an electronic component housing package using the same, an electronic device, and manufacturing methods thereof.

Means for Solving the Problems

As a result of many intensive studies, the present inventors have found that when a nickel layer is provided on one surface (a surface opposite the surface on which a metal brazing material layer is provided) of a base material before applying a rolling treatment and the thickness of the nickel layer after the rolling treatment is specified to be in a predetermined range, the above-described conventional problems can be solved. The present invention could be accomplished based on this finding.

Accordingly, the present invention is as follows.

1. A seal ring, which is an annular seal ring comprising: a nickel layer on the first surface of a base material containing KOVAR (iron-nickel-cobalt alloy) and a metal brazing material layer on the second surface opposite the first surface, wherein a thickness of the nickel layer is from 0.1 to 20 μm.
2. The seal ring according to above 1, comprising: a nickel layer between the second surface and the metal brazing material layer.
3. The seal ring according to above 1 or 2, wherein the base material comprises at least one member selected from the group consisting of silicon oxide, aluminum oxide, and manganese sulfide.
4. The seal ring according to any one of above 1 to 3, wherein the thickness of the nickel layer on the first surface is from 0.1 to 1% relative to a thickness of the base material after the rolling treatment.
5. A seal ring in which a nickel layer is provided on the first surface of a base material containing KOVAR, iron-nickel-cobalt alloy, a metal brazing material layer is provided on the second surface opposite the first surface, and a rolling treatment is applied to the base material, the seal ring which is annularly formed, wherein a thickness of the nickel layer after the rolling treatment is from 0.1 to 20 μm.
6. The seal ring according to above 5, which is obtainable by performing the rolling treatment at a rolling reduction rate of 30% or more.
7. The seal ring according to above 5 or 6, which is obtainable by performing a heat treatment at 500° C. or more before the rolling treatment.
8. A method for manufacturing a seal ring, comprising the following steps (1) to (3):
    (1) a step of providing a nickel layer on the first surface of a base material containing KOVAR (iron-nickel-cobalt alloy),
    (2) a step of providing a metal brazing material layer on the second surface opposite the first surface, and
    (3) a step of rolling the base material having provided thereon the nickel layer and the metal brazing material layer.
9. The manufacturing method of a seal ring according to above 8, wherein a thickness of the nickel layer is from 0.1 to 20 μm.

10. The manufacturing method of a seal ring according to above 8 or 9, wherein the rolling is performed at a rolling reduction rate of 30% or more.
11. The manufacturing method of a seal ring according to any one of above 8 to 10, wherein a heat treatment at 500° C. or more is performed before the rolling.
12. An electronic component housing package comprising: the seal ring according to any one of above 1 to 7, an electronic component housing case provided on the second surface via the metal brazing material layer, and a metal layer on a top surface of the nickel layer provided on the first surface.
13. The electronic component housing package according to above 12, wherein the metal layer is composed of a nickel layer.
14. The electronic component housing package according to above 12, wherein the metal layer is formed by providing an upper nickel layer and a gold layer in this order on the top surface of the nickel layer.
15. A method for manufacturing an electronic component housing package, comprising:
a step of joining the seal ring according to any one of above 1 to 7 to an electronic component housing case via the metal brazing material layer, and
a step of providing a metal layer on the nickel layer of the first surface.
16. An electronic device comprising:
the electronic component housing package according to any one of above 12 to 14,
an electronic component housed within the electronic component housing case, and a lid joined to the top of the metal layer.
17. A method for manufacturing an electronic device, comprising:
a step of preparing the electronic component housing package according to any one of above 12 to 14, a lid, and an electronic component,
a step of housing the electronic component within the electronic component housing case, and
a step of joining the lid to the top of the metal layer.

Effects of the Invention

The present inventors have discovered that the cause of a stain occurring on the top surface of a metal layer above a seal ring is silicon oxide, aluminum oxide and/or manganese sulfide, which are mixed as an unavoidable impurity in the production step of KOVAR. Such an impurity is rolled out in the rolling step, rises as a stain from the surface of a base material, furthermore, from the surface of a metal layer, and forms a void to deteriorate the airtightness between the seal ring and the lid.

In the present invention, since a nickel layer is provided on one surface (a surface opposite the surface on which a metal brazing material layer is provided) of a base material before applying a rolling treatment and the thickness of the nickel layer after the rolling treatment is specified to be in a predetermined range, an impurity rolled out in the rolling step is blocked by the nickel layer and restrained from rising from the surface of the metal layer, and generation of a stain can thereby be prevented, as a result, excellent airtightness between the seal ring and the lid can be provided.

BRIEF DESCRIPTION OF THE DRAWINGS

FIGS. 1(a) and 1(b) are a cross-sectional diagram for explaining one embodiment of the seal ring of the present invention.

FIG. 2 is a cross-sectional diagram of one embodiment of the electronic component housing package and electronic device of the present invention.

FIG. 3 is a cross-sectional diagram of another embodiment of the electronic component housing package and electronic device of the present invention.

FIGS. 4(1) to 4(8) are a diagram for explaining the method of joining a case having housed therein an electronic component to a lid by using the seal ring.

FIG. 5(a) is a plan view illustrating two stains generated on the conventional metal layer, and FIG. 5(b) is an enlarged photograph (b) of the stain.

MODE FOR CARRYING OUT THE INVENTION

The embodiments of the present invention are described in greater detail below.

FIGS. 1(a) and 1(b) are a cross-sectional diagram for explaining one embodiment of the seal ring of the present invention.

In FIG. 1(a), the seal ring 1 of the present invention has a nickel layer 14 on one surface of a base material 12 containing KOVAR (iron-nickel-cobalt alloy) and a metal brazing material layer 16 on the other surface and is annularly formed. In the present description, the surface having the nickel layer 14 of the base material 12 is referred to as a first surface, and the surface having the metal brazing material layer 16 is referred to as a second surface.

In addition, since the present invention includes an embodiment where, as described later, the top surface of a nickel layer 14 on the first surface of the seal ring 1 has a metal layer thereon at the time of manufacture of an electronic component housing package and the metal layer is composed of nickel, with the purpose of distinguishing this metal layer from the nickel layer 14, when the metal layer is composed of nickel, the metal layer is sometimes referred to as an upper nickel layer.

Each layer of the seal ring is described below.

The seal ring 1 of the present invention has a nickel layer 14 on the first surface of a base material 12 containing KOVAR (iron-nickel-cobalt alloy). The coefficient of thermal expansion of KOVAR is close to the coefficient of thermal expansion of ceramic, etc. of the electronic component housing package and therefore, even when heat is applied at the time of joining the seal ring to ceramic, etc. and the seal ring is then cooled, crack initiation can be suppressed.

Furthermore, in KOVAR, as described above, silicon oxide, aluminum oxide and/or manganese sulfide are mixed as an unavoidable impurity in the production step thereof, and the total of these unavoidable impurities in KOVAR is usually 1.5% or less, typically from 0.3 to 0.8%.

The thickness of the base material 12 may be appropriately set according to the size or use of an electronic component housing package that is the final product, but the thickness after applying a rolling treatment is, for example, from 0.1 to 20 mm, preferably from 0.3 to 3 mm.

The component ratio of iron, nickel, cobalt and unavoidable impurities in KOVAR used for the base material 12 is not particularly limited, and an appropriate component ratio may be employed so that the coefficient of thermal expansion of KOVAR can match the coefficient of thermal expansion of the case such as ceramic of the electronic component housing package.

The thickness of the nickel layer 14 needs to be from 0.1 to 20 μm in terms of the thickness after applying a rolling treatment. If the thickness is less than 0.1 μm, the layer is too thin, and generation of a stain cannot be prevented. Conversely, if the thickness exceeds 20 µm, thermal expansion is disadvantageously increased. In addition, if the film is excessively thick, film peeling or warpage occurs due to the effect of internal stress inside the film. This is also undesired in terms of productivity and cost. The thickness of the nickel layer 14 after applying a rolling treatment is preferably from 0.1 to 5 µm, more preferably from 0.2 to 2 µm.

In view of the surface coating effect and the difference in the coefficient of thermal expansion, the thickness of the nickel layer 14 after applying a rolling treatment is preferably from 0.1 to 1%, more preferably from 0.2 to 0.5%, relative to the thickness of the base material 12. When the thickness is 0.1% or more, the effect of preventing generation of a stain on the metal layer surface is sufficiently obtained. When the thickness is 1% or less, this is preferred because a failure due to thermal stress is hardly caused and cracking is less likely to occur upon cooling.

Furthermore, the seal ring 1 of the present invention has a metal brazing material layer 16 on the second surface of the base material 12 containing KOVAR (iron-nickel-cobalt alloy).

The metal brazing material layer 16 includes, as a gold alloy, for example, Au—Sn, Au—Si, Au—Ge, Au—Cu, and Au—Ge—Ni, and includes, as a silver alloy, for example, Ag—Cu, Ag—Sn, Ag—Cu—Sn—In, and Ag—Cu—In. Among others, a silver alloy is preferred, and Ag—Cu is more preferred.

The thickness of the metal brazing material layer 16 is, in terms of the thickness after applying a rolling treatment, for example, from 5 to 100 µm, preferably from 10 to 40 µm.

Next, the manufacturing method of the seal ring of the present invention is described. The manufacturing method includes the following steps (1) to (3):

(1) a step of providing a nickel layer 14 on the first surface of a base material 12 containing KOVAR (iron-nickel-cobalt alloy), (2) a step of providing a metal brazing material layer 16 on the second surface opposite the first surface, and (3) a step of rolling the base material 12 having provided thereon the nickel layer 14 and the metal brazing material layer 16.

In the step (1), the method for forming a nickel layer 14 on the first surface of the base material 12 is not particularly limited and includes, for example, a method of forming the layer by an electroplating process, a method of pressure-welding a nickel-made plate material to form a clad material, and a method of attaching a nickel-made foil.

In the step (2), the method for providing a metal brazing material layer 16 on the second surface of the base material 12 is not particularly limited, but from the viewpoint of enhancing the bondability, a method of pressure-welding a plate material composed of a metal brazing material to form a clad material is preferred.

Incidentally, in the case where an electroplating process is employed as the method for forming a nickel layer 14 on the first surface of the base material 12, as illustrated in FIG. 1(b), a nickel layer 14 is provided also on the second surface of the base material 12. That is, a nickel layer 14 is formed between the second surface of the base material 12 and the metal brazing material layer 16. According to this embodiment, an effect of enhancing the bondability of the brazing material to the base material is provided.

Subsequently, in the step (3), the base material 12 having provided thereon the nickel layer 14 and the metal brazing material layer 16 is rolled. The rolling treatment includes, for example, a known cold-rolling treatment using a roll, and the rolling reduction rate is, for example, 30% or more, preferably from 40 to 80%. When the rolling reduction rate is in this range, a stain on the metal layer surface can be prevented in the state of the nickel layer being thinner.

The base material 12 before rolling treatment is preferably subjected to a heat treatment at 500° C. or more, preferably from 600 to 800° C., because the adhesiveness of the nickel layer 14 and the rolling workability are enhanced.

Subsequently, a known means such as press treatment is applied to the base material 12 after rolling treatment, and an annular seal ring 1 in a desired size can thereby be obtained.

Next, the electronic component housing package and electronic device of the present invention are described.

FIG. 2 is a cross-sectional diagram of one embodiment of the electronic component housing package and electronic device of the present invention.

The electronic component housing package 2 of the present invention has a configuration where a seal ring 1 consisting of a base material 12, a nickel layer 14, and a metal brazing material layer 16, which is obtained as above, and an electronic component housing case 22 having housed therewithin an electronic component C are joined via the metal brazing material layer 16, a metal layer 24 is provided on the top surface of the nickel layer 14, and a lid 26 is joined to the top of the metal layer 24.

The electronic component C includes, for example, a piezoelectric component such as SAW filter and crystal oscillator, a semiconductor component such as semiconductor integrated circuit device and optical semiconductor device, and a sensor component. In addition, the electronic component C housed within the electronic component housing case 22 is airtightly sealed in a container (no reference numeral) formed by joining the electronic component housing case 22 and the lid 26 to each other, so as to configure an electronic device 3 such as crystal device.

The electronic component housing case 22 is not particularly limited, and a conventionally known case made of ceramic such as aluminum oxide or aluminum nitride may be used.

The metal layer 24 includes, for example, a nickel layer (upper nickel layer) and a gold layer.

The method for forming the metal layer 24 includes, for example, a method of forming the layer by an electroplating process, and a method of attaching a foil of a metal constituting the metal layer 24 onto the nickel layer 14.

The thickness of the metal layer 24 is preferably from 1 to 10 µm, more preferably from 2 to 5 µm.

In addition, as illustrated in FIG. 3, a metal layer 244 may be further provided as the metal layer 24 on the upper nickel layer 242. According to this embodiment, the airtightness with the lid 26 is advantageously more enhanced.

As for the lid 26, a low thermal expansion metal such as KOVAR or iron-nickel alloy can be used. Incidentally, with respect to the electronic device 3, the electronic component C airtightly sealed in the container between the lid 26 and the electronic component housing case 22 is electrically connected to an external electric circuit, for example, by a wiring conductor (not shown diagrammatically) provided on the surface and inside of the electronic component housing case 22. In this case, the wiring conductor is arranged to extend from the surface (e.g., the bottom surface in the concave portion) of the electronic component housing case 22 within the container to the outer surface such as undersurface or outside surface of the electronic component housing case 22.

The electronic component C is electrically connected to a portion of the wiring conductor, arranged within the container, by an electrically conductive connecting material (not shown diagrammatically) such as bonding wire and at the same time, a portion of the wiring conductor, arranged on the outer surface of the electronic component housing case, is electrically connected to an external electric circuit by an electrically conductive connecting material (not shown diagrammatically) such as low melting point brazing material, thereby electrically connecting the airtightly sealed electronic component C and the external electric circuit to each other. The external electric circuit is a circuit board provided in an electronic device, for example, a mobile phone (e.g., so-called smartphone), a computer, a device for image processing such as imaging, and a sensor device for various physical quantities such as acceleration.

The methods for manufacturing the electronic component housing package and electronic device of the present invention are described blow.

With respect to the electronic component housing package 2 of the present invention, as described above, the electronic component housing package 2 can be manufactured by joining a seal ring 1 consisting of a base material 12, a nickel layer 14, and a metal brazing material layer 16 with an electronic component housing case 22 having housed therewithin an electronic component C via the metal brazing material layer 16, and providing a metal layer 24 on the top surface of the nickel layer 14. In addition, finally, a lid 26 is joined to the top of the metal layer 24, and an electronic device 3 can thereby manufactured. The electronic component C may be housed after providing a metal layer 24 on the top surface of the nickel layer 14. More specifically, the manufacturing method of an electronic device 3 of the present invention includes a step of preparing the above-described electronic component housing package 2, a lid 26, and an electronic component C, a step of housing the electronic component C within the electronic component housing case 22, and a step of joining the lid 26 to the top of the metal layer 24.

The method for joining the seal ring 1 with the electronic component housing case 22 includes, for example, a brazing method using a brazing material such as silver solder, and the method for joining the metal layer 24 with the lid 26 includes, for example, a method of performing parallel seam welding. Incidentally, on the top surface of the electronic component housing case 22, although not shown diagrammatically, a metallized layer of tungsten, molybdenum, etc. working out to an underlying metal for brazing, and a metal layer thereon for brazing, such as nickel plating layer, are provided.

EXAMPLES

The present invention is described in greater detail below by referring to Examples, but the present invention is not limited to the following Examples.

Example 1

Nickel plating was applied by an electroplating process to the first surface and the second surface of a base material 12 composed of a KOVAR-made plate material (an iron-29 mass % nickel-17 mass % cobalt alloy containing 0.09% as silicon amount of silicon oxide, 0.01% as aluminum amount of aluminum oxide, and 0.34% as manganese amount of manganese sulfide, width: 20 mm, length 100 m) to provide a nickel layer 14 on each surface. Subsequently, a plate material (width: 20 mm, length: 100 m) composed of a silver-28 mass % copper alloy was pressure-welded as a metal brazing material to the second surface to provide a metal brazing material layer 16, fired at 600° C. for 3 minutes, and rolled at a rolling reduction rate of 60% to manufacture a seal ring material.

The seal ring material was worked by punching the second surface having provided thereon the metal brazing material to manufacture Seal Ring 1. The thickness of each layer of the obtained Seal Ring 1 is shown in Table 1.

On the nickel layer 14 of Seal Ring 1, nickel electroplating was applied to a thickness of 3 μm to provide an upper nickel layer 242 as the metal layer 24. Furthermore, gold plating was applied onto the upper nickel layer 242 to provide a gold layer 244, and the number of stains (number of stains/mm$^2$) generated on the top surface of the metal layer 244 was observed by means of an optical microscope at a magnification of 200 times. The stain generation rate is a value calculated from the number of manufactured products in which a stain was generated, after observing 10,000 manufactured products.

The results are shown in Table 1.

Example 2

Example 1 was repeated except that the thickness of each layer was changed as shown in Table 1.

The results are shown in Table 1.

Comparative Examples 1 to 3

Example 1 was repeated except that the nickel layer 14 was not provided and the thickness of each layer was changed as shown in Table 1.

The results are shown in Table 1.

TABLE 1

|  | Thickness of Metal Blazing Material Layer 16 (mm) | Thickness of Base Material 12 (mm) | Amount of Impurities (Al + Si + Mn) (%) | Thickness of Nickel Layer 14 (μm) | Thickness of Upper Nickel Layer 242 (μm) | Thickness of Gold Layer 244 (μm) | Stain Generation Rate (%) |
|---|---|---|---|---|---|---|---|
| Example 1 | 0.04 | 0.2 | 0.43 | 0.2 | 2.5 | 0.4 | 0 |
| Example 2 | 0.04 | 0.25 | 0.43 | 1.0 | 2.5 | 0.3 | 0 |
| Comparative Example 1 | 0.04 | 0.2 | 0.43 | — | 2.5 | 0.4 | 5.6 |
| Comparative Example 2 | 0.04 | 0.25 | 0.43 | — | 2.2 | 0.3 | 2.6 |
| Comparative Example 3 | 0.03 | 0.2 | 0.33 | — | 2.4 | 0.4 | 2.6 |

The results in Table 1 proved that since in the seal ring of each Example, the nickel layer 14 is formed with a predetermined thickness on the first surface of the base material, stain generation on the metal layer 24 is suppressed and excellent airtightness of the electronic component housing package can be provided.

On the other hand, it was found that since in the seal ring of each Comparative Example, the nickel layer 14 is not provided on the first surface of the base material, a stain is generated on the metal layer 24 and adversely affects the airtightness of the electronic component housing package.

While the invention has been described in detail and with reference to specific embodiments thereof, it will be apparent to one skilled in the art that various changes and modifications can be made therein without departing from the spirit and scope of the invention. This application is based on Japanese Patent Application (Patent Application No. 2015-250472) filed on Dec. 22, 2015, the entirety of which is incorporated herein by way of reference.

DESCRIPTION OF REFERENCE NUMERALS AND SIGNS

1 Seal ring
12 Base material
14 Nickel layer
16 Metal brazing material layer
2 Electronic component housing package
22 Electronic component housing case
24 Metal layer
242 Upper nickel layer
244 Gold layer
26 Lid
3 Electronic device
40 Clad material
402 KOVAR
404 Metal brazing material
46 Case
48 Metal layer
49 Lid
C Electronic component

The invention claimed is:

1. An electronic component housing package comprising:
an annular seal ring having
a nickel layer on a first surface of a base material containing KOVAR, iron-nickel-cobalt alloy, and
a metal brazing material layer on a second surface opposite the first surface,
wherein a thickness of the nickel layer is from 0.1 to 2 μm;
an electronic component housing case provided on the second surface via the metal brazing material layer; and
a metal layer on a top surface of the nickel layer provided on the first surface.

2. The electronic component housing package according to claim 1,
wherein the metal layer is composed of a nickel layer.

3. The electronic component housing package according to claim 1,
wherein the metal layer is formed by providing an upper nickel layer and a gold layer in this order on the top surface of the nickel layer.

4. A method for manufacturing an electronic component housing package, comprising:
a step of joining the seal ring according to claim 1 to an electronic component housing case via the metal brazing material layer, and
a step of providing a metal layer on the nickel layer of the first surface.

5. An electronic device comprising:
the electronic component housing package according to claim 1,
an electronic component housed within the electronic component housing case, and
a lid joined to the top of the metal layer.

6. A method for manufacturing an electronic device, comprising:
a step of preparing the electronic component housing package according to claim 1, a lid, and an electronic component,
a step of housing the electronic component within the electronic component housing case, and
a step of joining the lid to the top of the metal layer.

7. The electronic component housing package according to claim 1,
further comprising a nickel layer between the second surface and the metal brazing material layer.

8. The electronic component housing package according to claim 1,
wherein the base material comprises at least one member selected from the group consisting of silicon oxide, aluminum oxide, and manganese sulfide.

9. The electronic component housing package according to claim 1,
wherein the thickness of the nickel layer on the first surface is from 0.1 to 1% relative to a thickness of the base material.

10. The electronic component housing package according to claim 1,
wherein a rolling treatment is applied to the base material having provided thereon the nickel layer and the metal brazing material layer such that a thickness of the nickel layer after the rolling treatment is from 0.1 to 20 μm.

11. The electronic component housing package according to claim 10, which is obtainable by performing the rolling treatment at a rolling reduction rate of 30% or more.

12. The electronic component housing package according to claim 10, which is obtainable by performing a heat treatment at 500° C. or more before the rolling treatment.

* * * * *